United States Patent
Du

(10) Patent No.: US 11,624,977 B2
(45) Date of Patent: Apr. 11, 2023

(54) CORRECTION METHOD OF MASK LAYOUT AND MASK CONTAINING CORRECTED LAYOUT

(71) Applicants: Semiconductor Manufacturing International (Beijing) Corporation, Beijing (CN); Semiconductor Manufacturing International (Shanghai) Corporation, Shanghai (CN)

(72) Inventor: Yaojun Du, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 80 days.

(21) Appl. No.: 17/037,613

(22) Filed: Sep. 29, 2020

(65) Prior Publication Data

US 2021/0216008 A1 Jul. 15, 2021

(30) Foreign Application Priority Data

Jan. 9, 2020 (CN) .......................... 202010022648.4

(51) Int. Cl.
*G03F 1/36* (2012.01)
*G06F 30/392* (2020.01)

(52) U.S. Cl.
CPC .............. *G03F 1/36* (2013.01); *G06F 30/392* (2020.01)

(58) Field of Classification Search
CPC ..... G03F 1/36; G03F 1/72; G03F 1/76; G03F 7/70425; G06F 30/392
See application file for complete search history.

(56) References Cited

U.S. PATENT DOCUMENTS

2007/0035031 A1* 2/2007 Jessen ........................ G03F 1/36
430/5
2008/0113304 A1* 5/2008 Misaka ................... G03F 7/705
430/322

(Continued)

*Primary Examiner* — Jack Chiang
*Assistant Examiner* — Aric Lin
(74) *Attorney, Agent, or Firm* — Anova Law Group, PLLC

(57) ABSTRACT

Correction method of mask layout and mask containing corrected layout are provided. The method includes providing a target layout including a plurality of main patterns. Each main pattern includes a first side and an opposite second side. Extending directions of the first side and the second side are perpendicular to a first direction. Each main pattern also includes a third side and an opposite fourth side. Extension directions of the third side and the fourth side are perpendicular to a second direction. The second direction and the first direction are perpendicular to each other. The method also includes acquiring position information of each main pattern, and obtaining position information of auxiliary patterns adjacent to each main pattern. The method also includes, according to the position information of the auxiliary patterns adjacent to each main pattern, arranging the auxiliary patterns adjacent to each main pattern around each main pattern.

19 Claims, 7 Drawing Sheets

(56) References Cited

U.S. PATENT DOCUMENTS

| | | | |
|---|---|---|---|
| 2012/0107730 A1* | 5/2012 | Ishii | G03F 7/70125 430/5 |
| 2012/0210283 A1* | 8/2012 | Li | G06F 30/39 716/112 |
| 2017/0053058 A1* | 2/2017 | Yu | G06F 30/398 |
| 2020/0041891 A1* | 2/2020 | Hsu | G03F 1/38 |

* cited by examiner

Providing a target layout. The target layout includes a plurality of main patterns, and each main pattern of the plurality of main patterns includes a first side and a second side that are opposite each other. Extending directions of the first side and the second side are perpendicular to a first direction. In the first direction, a spacing between the first side and a center of the target layout is smaller than a spacing between the second side and the center of the target layout. Each main pattern also includes a third side and a fourth side that are opposite each other. Extension directions of the third side and the fourth side are perpendicular to a second direction. The second direction and the first direction are perpendicular to each other. — S100

According to the first side and the second side, acquiring position information of each main pattern. — S200

According to the position information of each main pattern, obtaining position information of auxiliary patterns adjacent to each main pattern. — S300

According to the position information of the auxiliary patterns adjacent to each main pattern, arranging the auxiliary patterns adjacent to each main pattern around each main pattern. — S400

Figure 1

CORRECTION METHOD OF MASK LAYOUT AND MASK CONTAINING CORRECTED LAYOUT

CROSS-REFERENCE TO RELATED APPLICATION

This application claims priority of Chinese Patent Application No. 202010022648.4, filed on Jan. 9, 2020, the entire content of which is hereby incorporated by reference.

FIELD OF THE DISCLOSURE

The present disclosure generally relates to the field of semiconductor manufacturing and, more particularly, relates to a correction method of a mask layout and a mask containing corrected layout.

BACKGROUND

Photolithography is an important technology in semiconductor manufacturing. Photolithography may be used to transfer a pattern from a mask to a silicon wafer, such that a semiconductor product that meets design requirements may be formed. A photolithography process may include an exposure step, a development step and an etching step. First, in the exposure step, light irradiates a silicon wafer coated with a photoresist layer through a mask with light-transmitting areas and reflective areas, and photochemically reacts with a photoresist of the photoresist layer. Next, in the development step, based on difference in dissolution rates of exposed and unexposed photoresists in a developer, a photolithography pattern may be formed, and a transfer of a mask pattern may thus be realized. Then, in the etching step, the silicon wafer is etched based on the photolithography pattern formed in the photoresist layer, and the mask pattern is thus transferred to the silicon wafer.

In an advanced photolithography process, extreme ultraviolet (EUV) light may be used as a light source. Since extreme ultraviolet light has a short wavelength, a photolithographic pattern with a small critical dimension may be formed.

However, in a photolithography process using extreme ultraviolet light as a light source, when a mask pattern is transferred to a photoresist layer on a silicon wafer, precision of a photolithography pattern formed may need to be improved. The disclosed structures and methods are directed to solve one or more problems set forth above and other problems in the art.

BRIEF SUMMARY OF THE DISCLOSURE

One aspect of the present disclosure includes a correction method of a mask layout. The method includes providing a target layout. The target layout includes a plurality of main patterns. Each main pattern of the plurality of main patterns includes a first side and a second side that are opposite each other. Extending directions of the first side and the second side are perpendicular to a first direction. In the first direction, a spacing between the first side and a center of the target layout is smaller than a spacing between the second side and the center of the target layout. Each main pattern also includes a third side and a fourth side that are opposite each other. Extension directions of the third side and the fourth side are perpendicular to a second direction, and a direction from a midpoint of the third side pointing to a midpoint of the fourth side coincides with the second direction. The second direction and the first direction are perpendicular to each other. The method also includes according to the first side and the second side, acquiring position information of each main pattern, and according to the position information of each main pattern, obtaining position information of auxiliary patterns adjacent to each main pattern. The method also includes according to the position information of the auxiliary patterns adjacent to each main pattern, arranging the auxiliary patterns adjacent to each main pattern around each main pattern.

Optionally, acquiring the position information of each main pattern includes, according to a central point of the main pattern, obtaining a first spacing of the main pattern. The central point of the main pattern is a point located between the first side and the second side of the main pattern. In the first direction, a spacing between the central point of the main pattern and the first side of the main pattern is equal to a spacing between the central point of the main pattern and the second side of the main pattern. The first spacing of the main pattern is, in the first direction, a spacing between the central point of the main pattern and the center of the target layout.

Optionally, according to the position information of each main pattern, obtaining the position information of auxiliary patterns adjacent to each main pattern includes obtaining position information of a first auxiliary pattern and a second auxiliary pattern. The first auxiliary pattern is an auxiliary pattern adjacent to the first side of the main pattern, and the second auxiliary pattern is an auxiliary pattern adjacent to the second side of the main pattern.

Optionally, obtaining the position information of the first auxiliary pattern and the second auxiliary pattern includes obtaining a first auxiliary spacing and a second auxiliary spacing. The first auxiliary spacing is, in the first direction, a spacing between a center of the first auxiliary pattern and the central point of the main pattern. The second auxiliary spacing is, in the first direction, a spacing between a center of the second auxiliary pattern and the central point of the main pattern. When the first spacing of the main pattern is equal to zero, the first auxiliary spacing is equal to the second auxiliary spacing.

Optionally, obtaining the position information of the first auxiliary pattern and the second auxiliary pattern includes obtaining a first auxiliary spacing and a second auxiliary spacing. The first auxiliary spacing is, in the first direction, a spacing between a center of the first auxiliary pattern and the central point of the main pattern. The second auxiliary spacing is, in the first direction, a spacing between a center of the second auxiliary pattern and the central point of the main pattern. When the first spacing of the main pattern is greater than zero, the first auxiliary spacing is greater than the second auxiliary spacing.

Optionally, obtaining the position information of the first auxiliary pattern and the second auxiliary pattern includes obtaining a first auxiliary spacing and a second auxiliary spacing. The first auxiliary spacing is, in the first direction, a minimum spacing between a contour of the first auxiliary pattern and the first side of the main pattern. The second auxiliary spacing is, in the first direction, a minimum spacing between a contour of the second auxiliary pattern and the second side of the main pattern. When the first spacing of the main pattern is equal to zero, the first auxiliary spacing is equal to the second auxiliary spacing.

Optionally, obtaining the position information of the first auxiliary pattern and the second auxiliary pattern includes obtaining a first auxiliary spacing and a second auxiliary spacing. The first auxiliary spacing is, in the first direction, a minimum spacing between a contour of the first auxiliary pattern and the first side of the main pattern. The second auxiliary spacing is, in the first direction, a minimum spacing between a contour of the second auxiliary pattern and the second side of the main pattern. When the first spacing of the main pattern is greater than zero, the first auxiliary spacing is greater than the second auxiliary spacing.

Optionally, according to the position information of each main pattern, obtaining the position information of auxiliary patterns adjacent to each main pattern includes obtaining position information of a third auxiliary pattern and a fourth auxiliary pattern. The third auxiliary pattern is an auxiliary pattern adjacent to the third side of the main pattern. The fourth auxiliary pattern is an auxiliary pattern adjacent to the fourth side of the main pattern.

Optionally, obtaining the position information of the third auxiliary pattern and the fourth auxiliary pattern includes obtaining a third auxiliary spacing and a fourth auxiliary spacing. The third auxiliary spacing is, in the second direction, a spacing between a center of the third auxiliary pattern and the central point of the main pattern. The fourth auxiliary spacing is, in the second direction, a spacing between a center of the fourth auxiliary pattern and the central point of the main pattern. The third auxiliary spacing is smaller than the fourth auxiliary spacing.

Optionally, obtaining the position information of the third auxiliary pattern and the fourth auxiliary pattern includes obtaining a third auxiliary spacing and a fourth auxiliary spacing. The third auxiliary spacing is, in the second direction, a minimum spacing between a contour of the third auxiliary pattern and the third side of the main pattern. The fourth auxiliary spacing is, in the second direction, a minimum spacing between a contour of the fourth auxiliary pattern and the fourth side of the main pattern. The third auxiliary spacing is smaller than the fourth auxiliary spacing.

Optionally, acquiring the position information of each main pattern also includes setting a first coordinate axis along the first direction. The center of the target layout coincides with a zero coordinate of the first coordinate axis, and coordinates of boundaries of the target layout on the first coordinate axis are −L/2 and L/2 respectively. The process also includes according to the first spacing of each main pattern, obtaining a coordinate x of the main pattern on the first coordinate axis.

Optionally, according to the position information of each main pattern, obtaining the position information of the auxiliary patterns adjacent to each main pattern includes, in the first direction, providing a first optimal spacing D1, a first maximum spacing D2, and a first minimum spacing D3. The first optimal spacing D1 is, without influence of an azimuth angle of an incident ray on a main pattern, an optimal spacing in the first direction between a first side of the main pattern and a first auxiliary pattern, or an optimal spacing between a second side of the main pattern and a second auxiliary pattern. The first auxiliary pattern is an auxiliary pattern adjacent to the first side of the main pattern, and the second auxiliary pattern is an auxiliary pattern adjacent to the second side of the main pattern. The first maximum spacing D2 is, in the target layout, a minimum spacing between the first side of a main pattern at a position closest to an edge of the target layout and a contour of the first auxiliary pattern of the main pattern. The first minimum spacing D3 is, in the target layout, a minimum spacing between the second side of the main pattern at the position closest to an edge of the target layout and a contour of the second auxiliary pattern of the main pattern, and:

$$\begin{cases} 2D1 = D2 + D3 \\ D3 < D1 < D2 \end{cases}.$$

Optionally, according to the position information of each main pattern, obtaining the position information of the auxiliary patterns adjacent to each main pattern also includes obtaining position information of the first auxiliary pattern. Obtaining the position information of the first auxiliary pattern includes obtaining a first auxiliary spacing A1:

$$\begin{cases} A1 = D1 - \dfrac{x}{\left(\dfrac{L}{2}\right)}(D1 - D3), -\dfrac{L}{2} < x \le 0 \\ A1 = D1 - \dfrac{x}{\left(\dfrac{L}{2}\right)}(D3 - D1), 0 < x \le \dfrac{L}{2} \end{cases}.$$

The first auxiliary spacing is, in the first direction, a minimum spacing between a contour of the first auxiliary pattern and the first side of the main pattern, or a spacing between a center of the first auxiliary pattern and the central point of the main pattern. The first optimal spacing D1 is, without the influence of the azimuth angle of the incident ray on the main pattern, the optimal spacing in the first direction between the first side of the main pattern and the first auxiliary pattern.

Optionally, according to the position information of each main pattern, obtaining the position information of the auxiliary patterns adjacent to each main pattern also includes obtaining position information of the second auxiliary pattern. Obtaining the position information of the second auxiliary pattern includes obtaining a second auxiliary spacing A2:

$$\begin{cases} A2 = D1 + \dfrac{x}{\left(\dfrac{L}{2}\right)}(D1 - D3), -\dfrac{L}{2} < x \le 0 \\ A2 = D1 + \dfrac{x}{\left(\dfrac{L}{2}\right)}(D3 - D1), 0 < x \le \dfrac{L}{2} \end{cases}.$$

The second auxiliary spacing A2 is, in the first direction, a minimum spacing between a contour of the second auxiliary pattern and the second side of the main pattern, or a spacing between a center of the second auxiliary pattern and the central point of the main pattern. The first optimal spacing D1 is, without the influence of the azimuth angle of the incident ray on the main pattern, the optimal spacing in the first direction between the second side of the main pattern and the second auxiliary pattern.

Optionally, according to the position information of each main pattern, obtaining the position information of the auxiliary patterns adjacent to each main pattern also includes, in the second direction, providing a second optimal spacing K1 and a second largest spacing K2. The second optimal spacing K1 is, when the first spacing of the main pattern is equal to zero, a minimum spacing between a contour of a third auxiliary pattern of the main pattern and the third side of the main pattern, the second maximum spacing K2 is, in the target layout, a minimum spacing between a third edge of a main pattern at a position closest to an edge of the target layout and a contour of a third auxiliary pattern of the main pattern, and K1<K2. The process also includes obtaining position information of the third auxiliary pattern, wherein the third auxiliary pattern is an auxiliary pattern adjacent to the third side of the main pattern. Obtaining the position information of the third auxiliary pattern includes obtaining a third auxiliary spacing B1:

$$B1 = K1 + \frac{|x|}{\left(\frac{L}{2}\right)}(K2 - K1), -\frac{L}{2} < x \leq \frac{L}{2}.$$

The third auxiliary spacing B1 is, in the second direction, a minimum spacing between a contour of the third auxiliary pattern and the third side of the main pattern, or a spacing between a center of the third auxiliary pattern and the central point of the main pattern.

Optionally, according to the position information of each main pattern, obtaining the position information of the auxiliary patterns adjacent to each main pattern also includes, in the second direction, providing a third optimal spacing K3 and a second minimum spacing K4. The third optimal spacing K3 is, when the first spacing of a main pattern is equal to zero, a minimum spacing between a contour of a fourth auxiliary pattern of the main pattern and a fourth side of the main pattern. The second minimum spacing K4 is, in the target layout, a minimum spacing between a fourth edge of a main pattern at a position closest to an edge of the target layout and a contour of the fourth auxiliary pattern of the main pattern, the fourth auxiliary pattern is an auxiliary pattern adjacent to the fourth side of the main pattern, and K1<K2<K4<K3. The process also includes obtaining position information of a fourth auxiliary pattern. The fourth auxiliary pattern is an auxiliary pattern adjacent to the fourth side of the main pattern. Obtaining the position information of the fourth auxiliary pattern includes obtaining a fourth auxiliary spacing B2:

$$B2 = K3 - \frac{|x|}{\left(\frac{L}{2}\right)}(K3 - K4), -\frac{L}{2} < x \leq \frac{L}{2}.$$

The fourth auxiliary spacing B2 is, in the second direction, a minimum spacing between a contour of the fourth auxiliary pattern and the fourth side of the main pattern, or a spacing between a center of the fourth auxiliary pattern and the central point of the main pattern.

Optionally, according to the position information of each main pattern, obtaining the position information of the auxiliary patterns adjacent to each main pattern also includes obtaining position information of a second auxiliary pattern. The second auxiliary pattern is an auxiliary pattern adjacent to the second side of the main pattern. Obtaining the position information of the second auxiliary pattern includes obtaining a second auxiliary spacing A2:

$$\begin{cases} A2 = D1 + \frac{x}{\left(\frac{L}{2}\right)}(D1 - D3), -\frac{L}{2} < x \leq 0 \\ A2 = D1 + \frac{x}{\left(\frac{L}{2}\right)}(D3 - D1), 0 < x \leq \frac{L}{2} \end{cases}.$$

The second auxiliary spacing A2 is, in the first direction, a minimum spacing between a contour of the second auxiliary pattern and the second side of the main pattern, or a spacing between a center of the second auxiliary pattern and the central point of the main pattern.

Optionally, according to the position information of each main pattern, obtaining the position information of the auxiliary patterns adjacent to each main pattern also includes in the second direction, providing a second optimal spacing K1 and a second largest spacing K2. The second optimal spacing K1 is, when the first spacing of a main pattern is equal to zero, a minimum spacing between a contour of a third auxiliary pattern of the main pattern and the third side of the main pattern. The second maximum spacing K2 is, in the target layout, a minimum spacing between the third edge of a main pattern at a position closest to an edge of the target layout and a contour of the third auxiliary pattern of the main pattern, the third auxiliary pattern is an auxiliary pattern adjacent to the third side of the main pattern, and K1<K2. The process also includes obtaining position information of a third auxiliary pattern. The third auxiliary pattern is an auxiliary pattern adjacent to the third side of the main pattern. Obtaining the position information of the third auxiliary pattern includes obtaining a third auxiliary spacing B1:

$$B1 = K1 + \frac{|x|}{\left(\frac{L}{2}\right)}(K2 - K1), -\frac{L}{2} < x \leq \frac{L}{2}.$$

The third auxiliary spacing B1 is, in the second direction, a minimum spacing between a contour of the third auxiliary pattern and the third side of the main pattern, or a spacing between a center of the third auxiliary pattern and the central point of the main pattern.

Optionally, according to the position information of each main pattern, obtaining the position information of the auxiliary patterns adjacent to each main pattern also includes, in the second direction, providing a third optimal spacing K3 and a second minimum spacing K4. The third optimal spacing K3 is, when the first spacing of a main pattern is equal to zero, a minimum spacing between a contour of a fourth auxiliary pattern of the main pattern and a fourth side of the main pattern. The second minimum spacing K4 is, in the target layout, a minimum spacing between a fourth edge of a main pattern at a position closest to an edge of the target layout and a contour of the fourth auxiliary pattern of the main pattern, and K4<K3. The process also includes obtaining position information of a fourth auxiliary pattern. The fourth auxiliary pattern is an auxiliary pattern adjacent to the fourth side of the main pattern. Obtaining the position information of the fourth auxiliary pattern includes obtaining a fourth auxiliary spacing B2:

$$B2 = K3 - \frac{|x|}{\left(\frac{L}{2}\right)}(K3 - K4), -\frac{L}{2} < x \leq \frac{L}{2}.$$

The fourth auxiliary spacing B2 is, in the second direction, a minimum spacing between a contour of the fourth auxiliary pattern and the fourth side of the main pattern, or a spacing between a center of the fourth auxiliary pattern and the central point of the main pattern.

Optionally, the target layout also includes a plurality of first areas and a plurality of second areas. For each main pattern, one first area of the plurality of first areas is located around the main pattern, and for each first area of the plurality of first areas, one second area of the plurality of second areas is located around the first area, and for each main pattern, auxiliary patterns adjacent to the main pattern are arranged in the first area, and auxiliary patterns that are not adjacent to the main pattern are arranged in the second area. The correction method of the mask layout also includes according to the position information of each main pattern or the position information of the auxiliary patterns adjacent to each main pattern, obtaining position information of fifth auxiliary patterns of each main pattern. The fifth auxiliary patterns of each main pattern are auxiliary patterns that are not adjacent to the main pattern, and are located in the second area of the main pattern. The method also includes arranging the fifth auxiliary patterns of each main pattern according to the position information of the fifth auxiliary patterns.

As disclosed, the technical solutions of the present disclosure have the following advantages.

In a correction method of a mask layout provided by the present disclosure, the target layout may be used to subsequently form a mask layout of a mask. To meet light requirements of the slit with an arc shape in the exposure system, along the first direction, each ray in incident light incident on the mask may have a different azimuth angle. On one hand, the extending directions of the first side and the second side are perpendicular to the first direction, and position information of each main pattern may be obtained according to the first side and the second side. Accordingly, the position information of each main pattern in the first direction may be obtained. On the other hand, according to the position information of each main pattern in the first direction, position information of the auxiliary patterns adjacent to each main pattern may be acquired. Moreover, according to the position information of the adjacent auxiliary patterns, auxiliary patterns adjacent to each main pattern may be arranged. Accordingly, the position information of the adjacent auxiliary patterns of the main pattern may be obtained for the azimuth angle that may change along the first direction. That is, the adjacent auxiliary patterns may be arranged according to the azimuth angle, such that the adjacent auxiliary patterns may be suitable for different azimuth angles. As such, in a photolithography system using extreme ultraviolet light as a light source, the size of the process window of the exposure process for each main pattern may be increased, and accuracy of the photolithography pattern formed may thus be improved.

Further, in an exposure process with extreme ultraviolet light as a light source, for a side perpendicular to the first direction in each main pattern, when the side is closer to the center of the target layout in the first direction, an azimuth angle of an incident ray may have smaller influence on the side, and thus the side may have a smaller deviation in the photolithography pattern formed. That is, when the first spacing of the main pattern is zero, the first side and the second side of the main pattern may have tiny or no deviations in the photolithographic pattern. Accordingly, when the first spacing of the main pattern is zero, the first auxiliary spacing is equal to the second auxiliary spacing. The first side and the second side may have tiny or no deviations in the photolithography pattern. On one hand, a suitable spacing may be maintained between the first auxiliary pattern and the first side, and between the second auxiliary pattern and the second side, and thus a size of a process window of the exposure process for the main pattern may be increased. On the other hand, a calculation for obtaining the first auxiliary spacing and the second auxiliary spacing may be simplified, mask fabrication may become easier, and time for mask fabrication may be reduced.

Further, in the exposure process using extreme ultraviolet light as the light source, a photolithography pattern formed may be affected by the azimuth angle of the incident ray. In the photolithography pattern formed, in the first direction, a side corresponding to the side perpendicular to the first direction in the main pattern may be offset toward the center of the target layout. Moreover, when a side perpendicular to the first direction in the main pattern has a greater distance from the center of the target layout, a side in the photolithographic pattern corresponding to the side perpendicular to the first direction in the main pattern may have a greater offset. That is, for each main pattern, the deviation of the first side of the main pattern may be smaller than the deviation of the second side of the main pattern. Accordingly, when the first spacing of the main pattern is greater than zero, in the first direction, the first auxiliary spacing is larger than the second auxiliary spacing. Thus, for each main pattern, the second side with a large deviation may be provided with a second auxiliary pattern with a small spacing, and the first side with a small deviation may be provided with a first auxiliary pattern with a large spacing. As such, suitable spacings may be maintained between the first auxiliary pattern and the first side, and between the second auxiliary pattern and the second side. Hence, the size of the process window for the exposure process of each main pattern may be increased, and accuracy of the photolithography pattern formed may thus be improved.

In the exposure process using extreme ultraviolet light as the light source, the photolithographic pattern formed may be affected by the azimuth angle and the polarization angle of the incident ray. In the photolithography pattern formed, in the second direction, sides corresponding to the sides perpendicular to the second direction in each main pattern, that is, sides corresponding to the third side and the fourth side, may have deviations. In addition, the side corresponding to the third side may have a larger deviation, and the side corresponding to the fourth edge may have a smaller deviation. Accordingly, in the second direction, the third auxiliary spacing may be made to be smaller than the fourth auxiliary spacing. That is, for each main pattern, the third side with large deviation may be provided with a third auxiliary pattern with a small auxiliary spacing. In addition, for the main pattern, the fourth side with a small deviation may be provided with a fourth auxiliary pattern with a large auxiliary spacing. Accordingly, suitable spacings may be maintained between the third auxiliary pattern and the third side, and between the fourth auxiliary pattern and the fourth side. Hence, the size of the process window for the exposure process of each main pattern may be increased, and accuracy of the photolithography pattern formed may thus be improved.

BRIEF DESCRIPTION OF THE DRAWINGS

The following drawings are merely examples for illustrative purposes according to various disclosed embodiments and are not intended to limit the scope of the present disclosure.

FIG. 1 illustrates is an exemplary flowchart of a correction method of a mask layout, consistent with the disclosed embodiments of the present disclosure.

DETAILED DESCRIPTION

Figure 2:
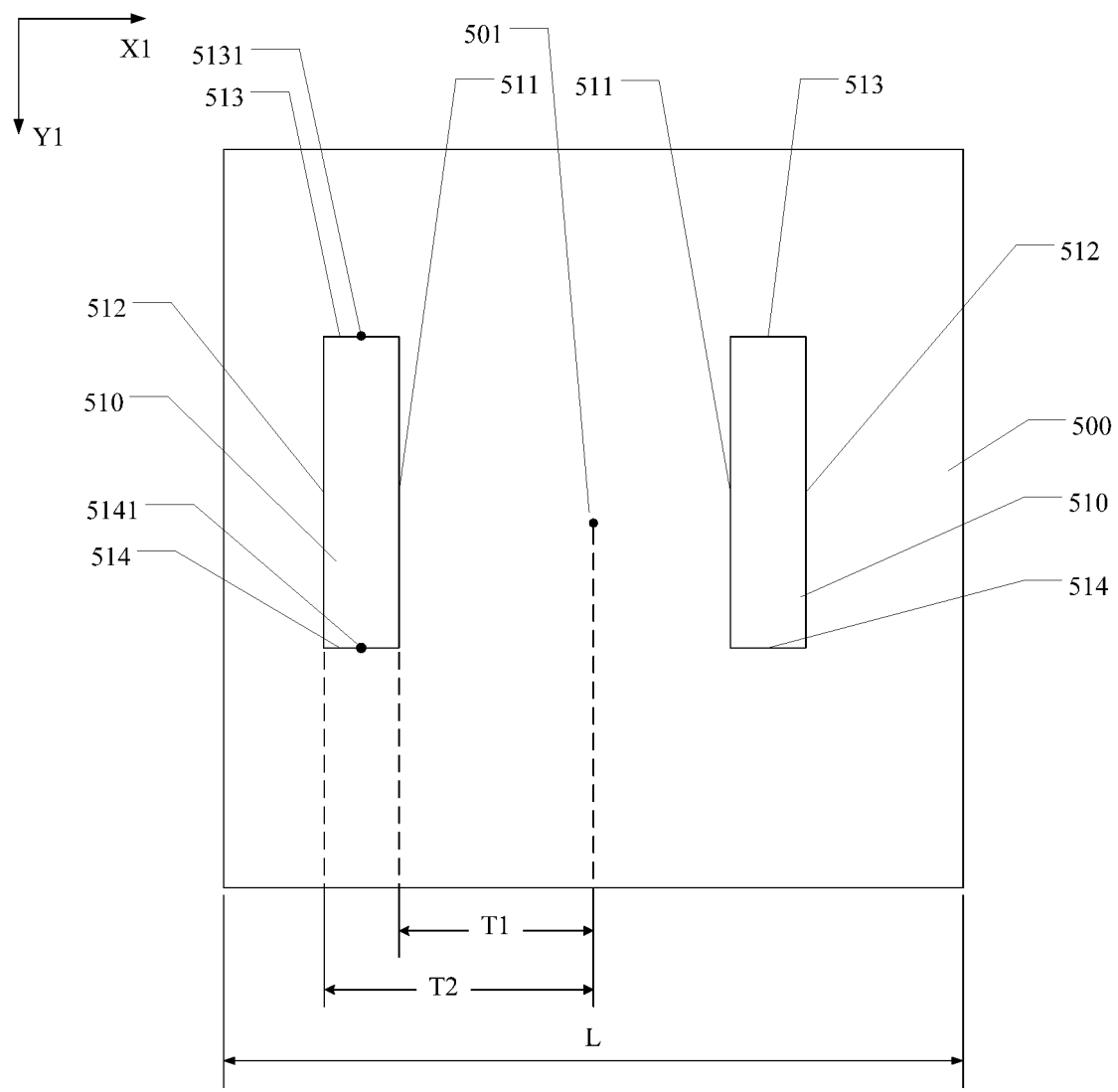
FIGS. 2 to 7 illustrate exemplary structures corresponding to certain stages of a correction method of a mask layout, consistent with the disclosed embodiments of the present disclosure.

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

In a photolithography process using extreme ultraviolet (EUV) light as a light source, when a mask pattern is transferred to a photoresist layer on a silicon wafer, precision of a photolithography pattern formed may need to be improved. Specifically, the mask pattern may include a main pattern and scattering bars arranged around the main pattern. The scattering bars may scatter incident light incident on a mask, but do not form an actual photolithographic pattern.

In a photolithography process using extreme ultraviolet light as a light source, an exposure system for the photolithography process may use an arc-shaped slit. For the arc-shaped slit, incident light incident on a mask may have different polarization angles and azimuth angles. Accordingly, there may be a deviation between a main pattern of the mask and a photolithography pattern actually formed on a photoresist layer of a wafer. Thus, actual spacings between scattering bars and the main pattern in a mask layout may be deviated. As a result, an effect of the scattering bars for increasing a process window of an exposure process may be compromised, and thus accuracy of the photolithography pattern may need to be improved.

The present disclosure provides a correction method of a mask layout. The method includes providing a target layout. The target layout includes a plurality of main patterns, and each main pattern may include a first side and a second side that are opposite each other. Extending directions of the first side and the second side are perpendicular to a first direction. Moreover, in the first direction, a spacing between the first side and a center of the target layout is smaller than a spacing between the second side and the center of the target layout. Each main pattern also includes a third side and a fourth side that are opposite each other. Extension directions of the third side and the fourth side are perpendicular to a second direction. The method also includes, according to the first side and the second side, acquiring position information of each main pattern, and according to the position information of each main pattern, obtaining position information of an auxiliary pattern adjacent to each main pattern. The method also includes, according to the position information of the auxiliary pattern adjacent to each main pattern, arranging the auxiliary pattern adjacent to each main pattern around a corresponding main pattern. The correction method of mask layout may increase a process window of an exposure process, and accuracy of a photolithography pattern may thus be improved.

FIG. 1 illustrates is an exemplary flowchart of a correction method of a mask layout, consistent with the disclosed embodiments of the present disclosure. As shown in FIG. 1, the correction method of a mask layout includes following steps.

Step S100: providing a target layout. The target layout may include a plurality of main patterns, and each main pattern may include a first side and a second side that are opposite each other. Extending directions of the first side and the second side are perpendicular to a first direction. Moreover, in the first direction, a spacing between the first side and a center of the target layout is smaller than a spacing between the second side and the center of the target layout. Each main pattern may also include a third side and a fourth side that are opposite each other. Extension directions of the third side and the fourth side are perpendicular to a second direction. The second direction is perpendicular the first direction.

Step S200: according to the first side and the second side, acquiring position information of each main pattern.

Step S300: according to the position information of each main pattern, obtaining position information of an auxiliary pattern adjacent to each main pattern.

Step S400: according to the position information of the auxiliary pattern adjacent to each main pattern, arranging the auxiliary pattern adjacent to each main pattern around a corresponding main pattern.

FIGS. 2 to 7 illustrate exemplary structures corresponding to certain stages of a correction method of a mask layout, consistent with the disclosed embodiments of the present disclosure.

Referring to FIG. 2, at the beginning of the exemplary process, a target layout 500 is provided. The target layout 500 may be used to form a mask layout of a mask. The target layout 500 includes a plurality of main patterns 510.

Each main pattern 510 includes a first side 511 and a second side 512 opposite each other. Extending directions of the first side 511 and the second side 512 are perpendicular to a first direction X1. In the first direction X1, a spacing T1 between the first side 511 and a center 501 of the target layout 500 is smaller than a spacing T2 between the second side 512 and the center 501 of the target layout.

Each main pattern also includes a third side 513 and a fourth side 514 opposite each other. Extending directions of the third side 513 and the fourth side 514 are perpendicular to a second direction Y1. A direction from a midpoint 5131 of the third side 513 pointing to a midpoint 5141 of the fourth side 514 is same as the second direction Y1. The second direction Y1 and the first direction X1 are perpendicular to each other.

In one embodiment, a total length of the target layout 500 in the first direction X1 is L.

It should be noted that only two main patterns 510 are exemplarily shown in FIG. 2. In the present disclosure, the target layout 500 may include one, two or more main patterns.

Figure 3:
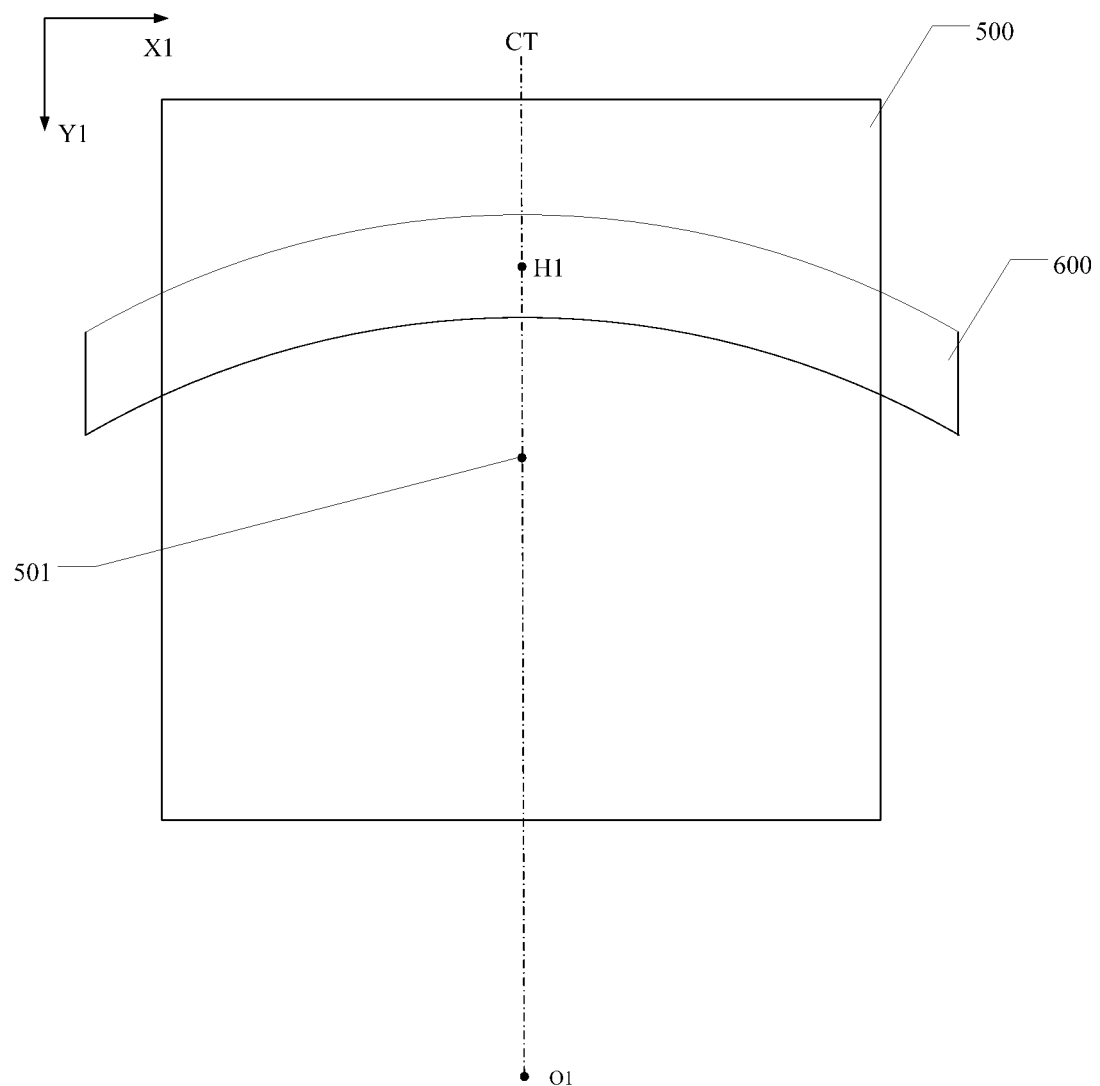

FIG. 3 illustrates a relative positional relationship between the target layout shown in FIG. 2 and a slit in an exposure system. Referring to FIG. 3, the exposure system includes a slit 600, and the slit 600 has an arc shape. The center 501 of the target layout 500 is on a center line CT of the slit 600. The second direction Y1 coincides with a direction from a midpoint H1 of the arc shape of the slit 600 pointing to a circle center O1 of the arc shape of the slit 600.

To meet light requirements of the slit 600 with the arc shape in the exposure system, along the first direction X1, each ray in incident light incident on the mask may have a different azimuth angle. In the second direction Y1, each ray in the incident light incident on the mask may have a different polarization angle.

Figure 4:
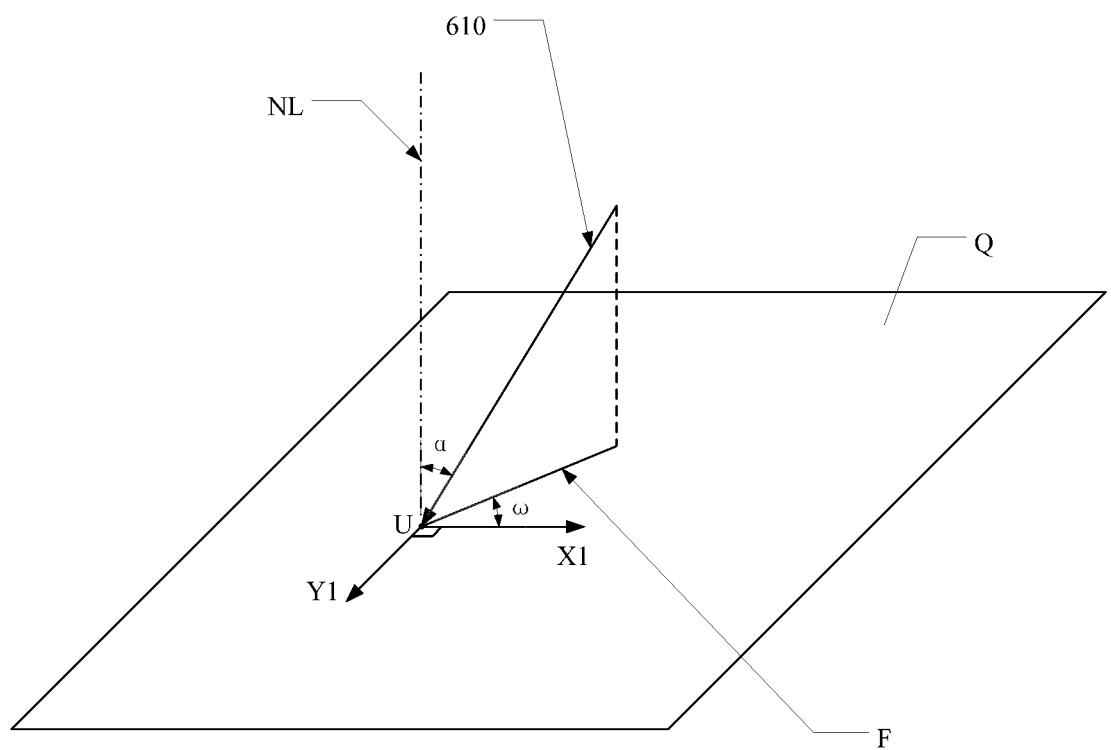

FIG. 4 illustrates a schematic of incident light incident on a mask. The incident light includes a plurality of incident rays 610. FIG. 4 schematically shows one incident ray 610 of the plurality of incident rays. FIG. 4 also schematically shows an incident point U of the incident light ray 610 incident on the mask and an incident surface Q where the incident point U is located, such that the polarization angle and the azimuth angle of the incident light ray 610 may be described. The incident surface Q is a surface of the mask that is illuminated by the incident light.

As shown in FIG. 4, the incident ray 610 is incident on the incident point U in the mask. There is an angle α between the incident ray 610 and a normal line NL perpendicular to the incident surface Q. The angle α is the polarization angle of the incident ray 610. Along the second direction Y1, the angle α may change along the slit 600 with the arc shape, and the angle α may be in a range of approximately 3° to 9°.

As shown in FIG. 4, the incident ray 610 has a projection F on the incident surface Q. There is an angle ω between the projection F and the first direction X1, and the angle ω is the azimuth angle of the incident ray 610.

When the incident ray 610 rotates around the normal line NL, the incident ray 610 may have a different direction of the projection F on the incident surface Q, and thus a different value of the angle ω. That is, the incident ray 610 may rotate around the normal line NL, and thus have a different value of the azimuth angle with the first direction X1.

The angle ω (the azimuth angle of the incident ray 610) may be different at different incident positions along the first direction X1 (different incident points along the first direction X1). That is, a position of the incident point along the first direction X1 may determine the azimuth angle of the incident ray 610.

In summary, to meet the light requirements of the slit 600 with the arc shape in the exposure system, each incident ray 610 of the incident light incident on the mask may have a different value of the polarization angle with the normal line NL perpendicular to the surface of the mask. Meanwhile, the incident light 610 may rotate around the normal line NL, and thus have a different value of the azimuth angle with the first direction X1.

Figure 5:
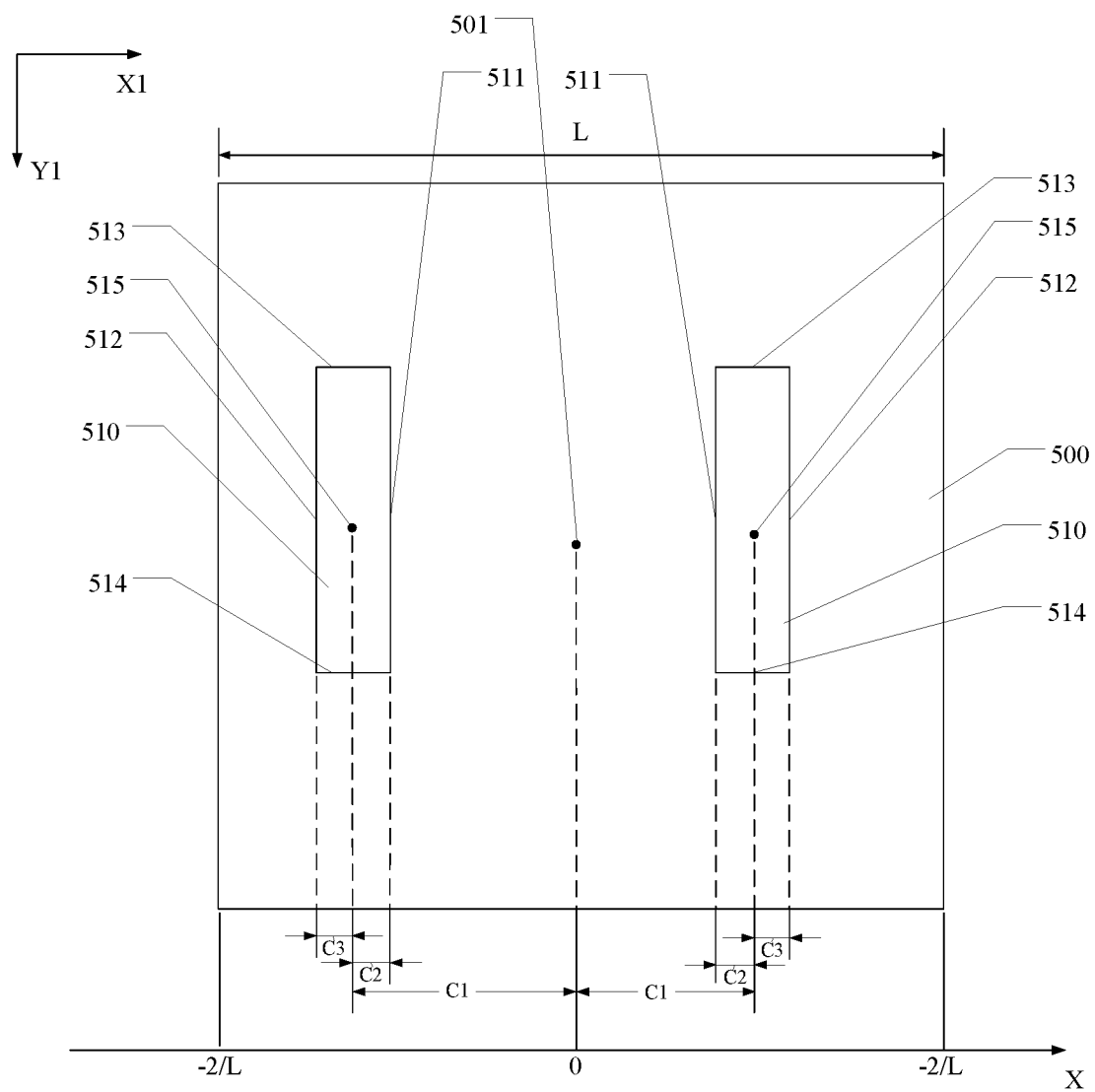

Referring to FIG. 5, according to the first side 511 and the second side 512, the position information of each main pattern 510 may be obtained. Specially, in one embodiment, obtaining the position information of each main pattern 510 includes obtaining a first spacing C1 of the main pattern 510 according to a central point 515 of the main pattern.

The central point 515 of the main pattern 510 is a point located between the first side 511 and the second side 512 of the main pattern 510. In the first direction X1, a spacing C2 between the central point 515 of the main pattern and the first side 511 is equal to a spacing C3 between the central point 515 of the main pattern and the second side 512. The first spacing C1 is, in the first direction X1, a spacing between the central point 515 of the main pattern and the center 501 of the target layout.

In one embodiment, obtaining the position information of each main pattern also includes setting a first coordinate axis X along the first direction X1. The center 501 of the target layout 500 coincides with the zero coordinate of the first coordinate axis X. Coordinates of boundaries of the target layout on the first coordinate axis X are −L/2 and L/2 respectively. The process also includes, according to the first spacing C1 of each main pattern 510, obtaining a coordinate x of the main pattern 510 on the first coordinate axis X.

Specifically, in one embodiment, an absolute value |x| of the coordinate x is equal to the first spacing C1, that is, $$\begin{cases} x = C1, \ 0 < x \le \dfrac{L}{2} \\ x = -C1, \ -\dfrac{L}{2} < x \le 0 \end{cases}.$$

Figure 6:
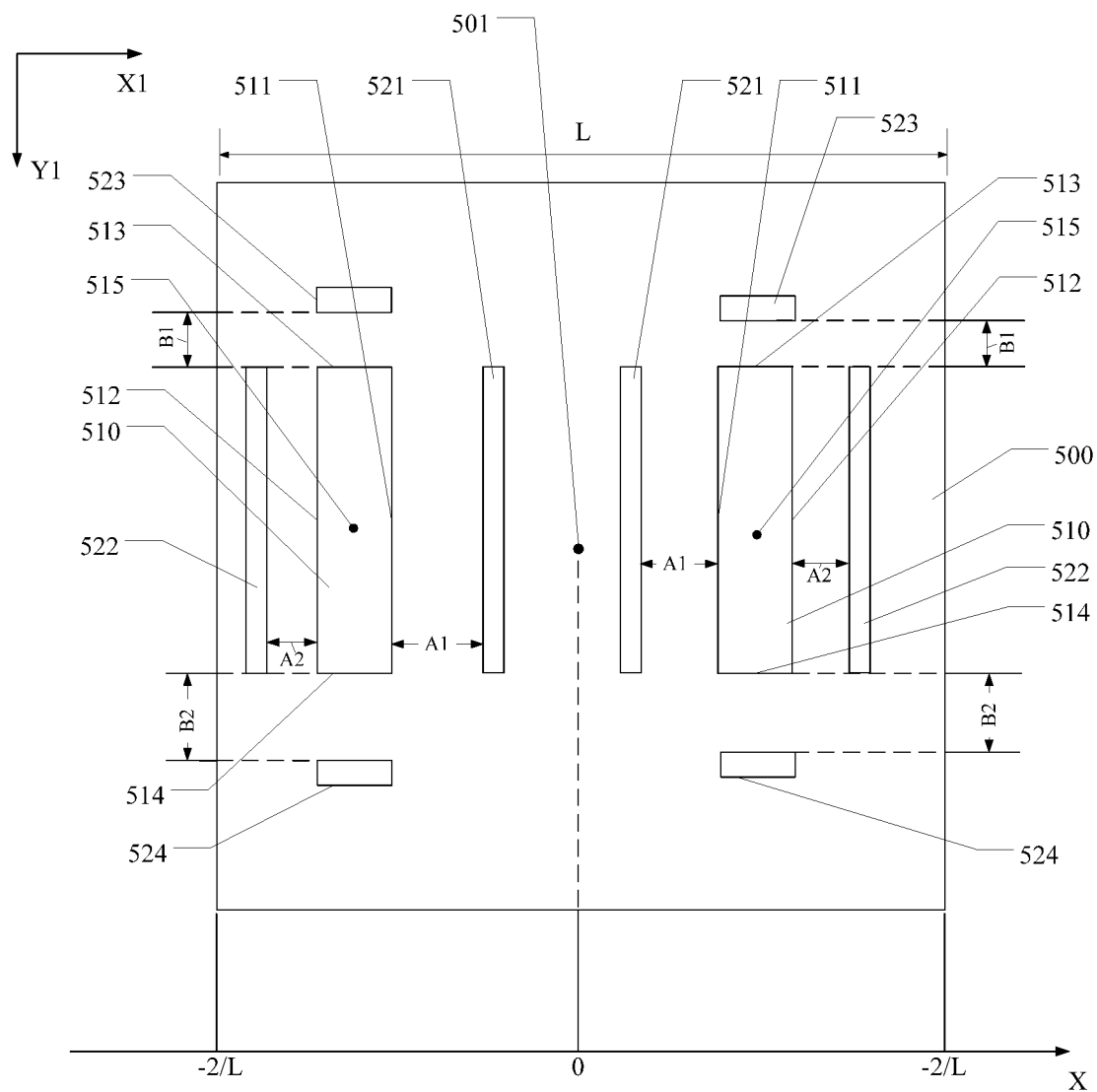

Referring to FIG. 6, according to the position information of each main pattern 510, position information of auxiliary patterns adjacent to each main pattern 510 may be obtained.

Obtaining the position information of the auxiliary patterns adjacent to each main pattern 510 includes obtaining position information of a first auxiliary pattern 521. The first auxiliary pattern 521 is an auxiliary pattern adjacent to the first side 511 of the main pattern 510.

Obtaining the position information of the first auxiliary pattern 521 includes obtaining a first auxiliary spacing A1.

In one embodiment, the first auxiliary spacing A1 is, in the first direction X1, a minimum spacing between a contour of the first auxiliary pattern 521 and the first side 511 of the main pattern 510. In some other embodiments, the first auxiliary spacing A1 is, in the first direction X1, a spacing between a center of the first auxiliary pattern and the central point of the main pattern.

Obtaining the position information of the auxiliary patterns adjacent to each main pattern 510 also includes obtaining position information of a second auxiliary pattern 522. The second auxiliary pattern 522 is an auxiliary pattern adjacent to the second side 512 of the main pattern 510.

Obtaining the position information of the second auxiliary pattern 522 includes obtaining a second auxiliary spacing A2.

In one embodiment, the second auxiliary spacing A2 is, in the first direction X1, a minimum spacing between a contour of the second auxiliary pattern 522 and the second side 512 of the main pattern 510. In some other embodiments, the second auxiliary spacing is, in the first direction, a spacing between a center of the second auxiliary pattern and the central point of the main pattern.

In one embodiment, when the first spacing C1 of the main pattern 510 is equal to zero, the first auxiliary spacing A1 is equal to the second auxiliary spacing A2.

In an exposure process with extreme ultraviolet light as a light source (as shown in FIGS. 3 to 4), for a side perpendicular to the first direction X1 in each main pattern 510, when the side is closer to the center of the target layout in the first direction X1, an azimuth angle of an incident ray 610 may have smaller influence on the side, and thus the side may have a smaller deviation in the photolithography pattern formed. That is, when the first spacing C1 of the main pattern 510 is zero, the first side 511 and the second side 522 of the main pattern 510 may have tiny or no deviations in the photolithographic pattern.

Accordingly, when the first spacing C1 of the main pattern 510 is zero, the first auxiliary spacing A1 is equal to the second auxiliary spacing A2. The first side 511 and the second side 512 may have tiny or no deviations in the photolithography pattern. On one hand, a suitable spacing may be maintained between the first auxiliary pattern 521 and the first side 511, and between the second auxiliary pattern 522 and the second side 512, and thus a size of a process window of the exposure process for the main pattern 510 may be increased. On the other hand, a calculation for obtaining the first auxiliary spacing A1 and the second auxiliary spacing A2 may be simplified, mask fabrication may become easier, and time for mask fabrication may be reduced.

In one embodiment, when the first spacing C1 of the main pattern 510 is greater than zero, the first auxiliary spacing A1 is greater than the second auxiliary spacing A2.

In the exposure process using extreme ultraviolet light as the light source (as shown in FIGS. 3 to 4), a photolithography pattern formed may be affected by the azimuth angle of the incident ray 610. In the photolithography pattern formed, in the first direction X1, a side corresponding to the side perpendicular to the first direction X1 in the main pattern 510 may be offset toward the center 501 of the target layout 500. Moreover, when a side perpendicular to the first direction X1 in the main pattern has a greater distance from the center 501 of the target layout 500, a side in the photolithographic pattern corresponding to the side perpendicular to the first direction X1 in the main pattern may have a greater offset. That is, for each main pattern 510, the deviation of the first side 511 of the main pattern 510 is smaller than the deviation of the second side 512 of the main pattern 510.

Accordingly, when the first spacing C1 of the main pattern 510 is greater than zero, in the first direction X1, the first auxiliary spacing A1 is larger than the second auxiliary spacing A2. Thus, for each main pattern 510, the second side 512 with a large deviation may be provided with a second auxiliary pattern 522 with a small spacing, and the first side 511 with a small deviation may be provided with a first auxiliary pattern 521 with a large spacing. As such, suitable spacings may be maintained between the first auxiliary pattern 521 and the first side 511, and between the second auxiliary pattern 522 and the second side 512. Hence, the size of the process window for the exposure process of each main pattern 510 may be increased, and accuracy of the photolithography pattern formed may thus be improved.

In one embodiment, obtaining the position information of the auxiliary patterns adjacent to each main pattern 510 also includes obtaining position information of a third auxiliary pattern 523. The third auxiliary pattern 523 is an auxiliary pattern adjacent to the third side 513 of the main pattern 510.

Obtaining the position information of the third auxiliary pattern 523 includes obtaining a third auxiliary spacing B1.

In one embodiment, the third auxiliary spacing B1 is, in the second direction Y1, a minimum spacing between a contour of the third auxiliary pattern 523 and the third side 513 of the main pattern 510. In some other embodiments, the third auxiliary spacing is, in the second direction, a spacing between a center of the third auxiliary pattern and the central point of the main pattern.

In one embodiment, obtaining the position information of the auxiliary patterns adjacent to each main pattern 510 also includes obtaining position information of a fourth auxiliary pattern 524. The fourth auxiliary pattern 524 is an auxiliary pattern adjacent to the fourth side 514 of the main pattern 510.

Obtaining the position information of the fourth auxiliary pattern 524 includes obtaining a fourth auxiliary spacing B2.

In one embodiment, the fourth auxiliary spacing B2 is, in the second direction Y1, a minimum spacing between a contour of the fourth auxiliary pattern 524 and the fourth side 514 of the main pattern 510. In some other embodiments, the fourth auxiliary spacing is, in the second direction, a spacing between a center of the fourth auxiliary pattern and the central point of the main pattern.

In one embodiment, the third auxiliary spacing B1 is smaller than the fourth auxiliary spacing B2.

In the exposure process using extreme ultraviolet light as the light source (as shown in FIGS. 3 to 4), the photolithographic pattern formed may be affected by the azimuth angle and the polarization angle of the incident ray 610. In the photolithography pattern formed, in the second direction Y1, sides corresponding to the sides perpendicular to the second direction Y2 in each main pattern 510, that is, sides corresponding to the third side 513 and the fourth side 514, may have deviations. In addition, the side corresponding to the third side 513 may have a larger deviation, and the side corresponding to the fourth edge 514 may have a smaller deviation.

Accordingly, in the second direction Y1, the third auxiliary spacing B1 may be made to be smaller than the fourth auxiliary spacing B2. That is, for each main pattern 510, the third side 513 with large deviation may be provided with a third auxiliary pattern 523 with a small auxiliary spacing. In addition, for the main pattern 510, the fourth side 514 with a small deviation may be provided with a fourth auxiliary pattern 524 with a large auxiliary spacing. Accordingly, suitable spacings may be maintained between the third auxiliary pattern 523 and the third side 513, and between the fourth auxiliary pattern 524 and the fourth side 514. Hence, the size of the process window for the exposure process of each main pattern 510 may be increased, and accuracy of the photolithography pattern formed may thus be improved.

Figure 7:
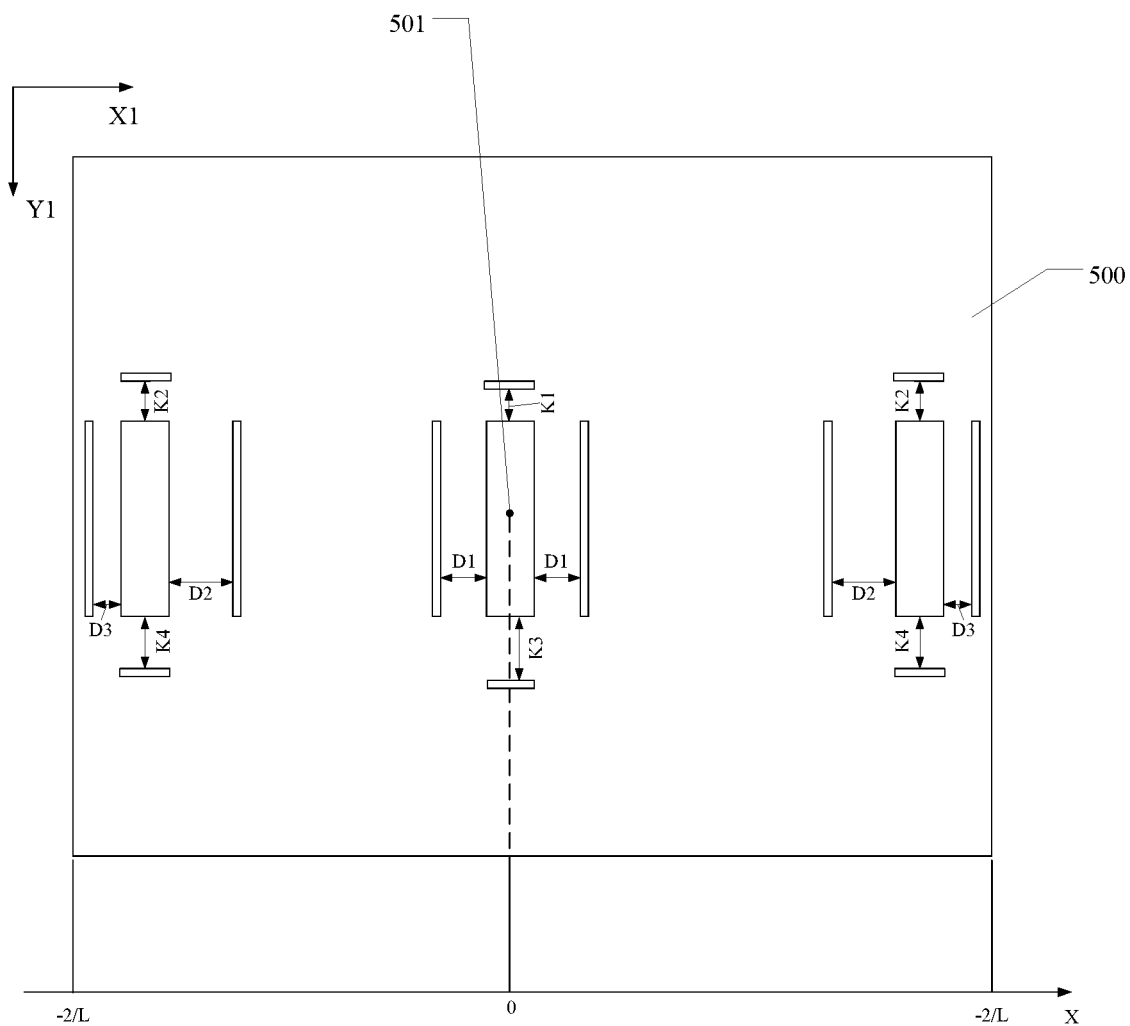

Referring to FIGS. 6 and 7, according to the position information of each main pattern 510, position information of the auxiliary patterns adjacent to each main pattern 510 may be obtained.

Obtaining the position information of the auxiliary patterns adjacent to each main patterns 510 also includes, in the first direction X1, providing a first optimal spacing D1, a first maximum spacing D2, and a first minimum spacing D3, with $$\begin{cases} 2D1 = D2 + D3 \\ D3 < D1 < D2 \end{cases}.$$

Specifically, the first optimal spacing D1 is, without the influence of the azimuth angle of the incident ray 610 on each main pattern 510, an optimal spacing in the first direction X1 between the first side 511 of the main pattern 510 and the first auxiliary pattern 521, or an optimal spacing between the second side 512 of the main pattern 510 and the second auxiliary pattern 522.

When the first spacing C1 of the main pattern 510 is equal to zero, the azimuth angle of the incident ray 610 may have least effect on the main pattern 510. Accordingly, the first optimal spacing D1 may be represented by a main pattern 510 with a first spacing C1 equal to zero, and a first auxiliary pattern 521 and a second auxiliary pattern 522 of the main pattern 510.

The first maximum spacing D2 is, in the target layout 500, a minimum spacing between the first side 511 of a main pattern 510 at a position closest to an edge of the target layout 500 and a contour of the first auxiliary pattern 521 of the main pattern 510.

The first minimum spacing D3 is, in the target layout 500, a minimum spacing between the second side 512 of the main pattern 510 at a position closest to an edge of the target layout 500 and a contour of the second auxiliary pattern 522 of the main pattern 510.

In one embodiment, the first auxiliary spacing A1 acquired may be given by:

$$\begin{cases} A1 = D1 - \dfrac{x}{\left(\dfrac{L}{2}\right)}(D1 - D3), -\dfrac{L}{2} < x \le 0 \\ A1 = D1 - \dfrac{x}{\left(\dfrac{L}{2}\right)}(D3 - D1), 0 < x \le \dfrac{L}{2} \end{cases}.$$

It should be noted that since 2D1=D2+D3, D1 is an average value of D2 and D3, that is, D2–D1=D1–D3.

On one hand, when the first auxiliary spacing A1 is in a range from the first optimal spacing D1 to the first maximum spacing D2, the size of the process window for the main pattern 510 may be better increased. That is, the range from the first optimal spacing D1 to the first maximum spacing D2 is a preferable range of the first auxiliary spacing A1. On the other hand, when an absolute value of the coordinate x of the main pattern 510 is larger, the first side 511 of the main pattern 510 may have a larger deviation. Accordingly, through the above formula, a more suitable first auxiliary spacing A1 may be obtained according to the position of the main pattern in the target layout 500, such that the size of the process window for the main pattern 510 may be better increased.

In one embodiment, the second auxiliary spacing A2 acquired may be given by:

$$\begin{cases} A2 = D1 + \dfrac{x}{\left(\dfrac{L}{2}\right)}(D1 - D3), -\dfrac{L}{2} < x \le 0 \\ A2 = D1 + \dfrac{x}{\left(\dfrac{L}{2}\right)}(D3 - D1), 0 < x \le \dfrac{L}{2} \end{cases}.$$

On one hand, when the second auxiliary spacing A2 is in a range from the first optimal spacing D1 to the first minimum spacing D3, the size of the process window for the main pattern 510 may be better increased. That is, the range from the first optimal spacing D1 to the first minimum spacing D3 is a preferable range of the second auxiliary spacing A2. On the other hand, when the absolute value of the coordinate x of the main pattern 510 is larger, the second side 512 of the main pattern 510 may have a larger deviation. Therefore, through the above formula, a more suitable second auxiliary spacing A2 may be obtained according to the position of the main pattern in the target layout 500, such that the size of the process window for the main pattern 510 may be better increased.

It should be noted that the target layout 500 may include a main pattern 510 with the first spacing C1 equal to zero, or may not include the main pattern 510 with the first spacing C1 equal to zero. The main pattern 510 in the target layout 500 may be set at a position closest to an edge of the target layout 500, or the main pattern 510 in the target layout 500 may not be set at a position closest to an edge of the target layout 500.

In one embodiment, obtaining the position information of the auxiliary patterns adjacent to each main pattern 510 also includes, in the second direction Y2, providing a second optimal spacing K1 and a second largest spacing K2, with K1<K2.

Specifically, in one embodiment, the second optimal spacing K1 is, when the first spacing C1 of the main pattern 510 is equal to zero, a minimum spacing between the contour of the third auxiliary pattern 523 of the main pattern 510 and the third side 513 of the main pattern 510.

In one embodiment, the second maximum spacing K2 is, in the target layout 500, the minimum spacing between the third edge 513 of a main pattern 510 at a position closest to an edge of the target layout 500 and the contour of the third auxiliary pattern 523 of the main pattern 510.

In one embodiment, the third auxiliary spacing B1 acquired may be given by:

$$B1 = K1 + \dfrac{|x|}{\left(\dfrac{L}{2}\right)}(K2 - K1), -\dfrac{L}{2} < x \le \dfrac{L}{2}.$$

On one hand, when the third auxiliary spacing B1 is in a range from the second optimal spacing K1 to the second maximum spacing K2, the size of the process window for the main pattern 510 may be better increased. That is, the range from the second optimal spacing K1 to the second maximum spacing K2 is a preferable range of the third auxiliary spacing B1. On the other hand, when the absolute value of the coordinate x of the main pattern 510 is larger, the third side 513 of the main pattern 510 may have a larger deviation. Accordingly, through the above formula, a more suitable third auxiliary spacing B1 may be obtained according to the position of the main pattern in the target layout 500, such that the size of the process window for the main pattern 510 may be better increased.

In one embodiment, obtaining the position information of the auxiliary patterns adjacent to each main pattern 510 also includes, in the second direction Y2, providing a third optimal spacing K3 and a second minimum spacing K4, with K4<K3.

Specifically, in one embodiment, the third optimal spacing K3 is, when the first spacing C1 of the main pattern 510 is equal to zero, a minimum spacing between a contour of the fourth auxiliary pattern 524 of the main pattern 510 and the fourth side 514 of the main pattern 510.

In one embodiment, the second minimum spacing K4 is, in the target layout 500, a minimum spacing between the fourth edge 514 of a main pattern 510 at a position closest to an edge of the target layout 500 and a contour of the fourth auxiliary pattern 524 of the main pattern 510.

In one embodiment, a relationship between the third optimal spacing K3, the second minimum spacing K4, the second optimal spacing K1, and the second maximum spacing K2 also includes: K1<K2<K4<K3.

In one embodiment, the fourth auxiliary spacing B2 acquired may be given by:

$$B2 = K3 - \dfrac{|x|}{\left(\dfrac{L}{2}\right)}(K3 - K4), -\dfrac{L}{2} < x \le \dfrac{L}{2}.$$

On one hand, when the fourth auxiliary spacing B2 is in a range from the third optimal spacing K3 to the second minimum spacing K4, the size of the process window for the main pattern 510 may be better increased. That is, the range from the third optimal spacing K3 to the second minimum spacing K4 is a preferable range of the fourth auxiliary spacing B2. On the other hand, when the absolute value of the coordinate x of the main pattern 510 is larger, the fourth side 514 of the main pattern 510 may have a larger deviation.

Accordingly, through the above formula, a more suitable fourth auxiliary spacing B2 may be obtained according to the position of the main pattern in the target layout 500, such that the size of the process window for the main pattern 510 may be better increased.

With continuous reference to FIG. 6, according to the position information of the auxiliary patterns adjacent to each main pattern 510, auxiliary patterns adjacent to each main pattern 510 may be arranged around a corresponding main pattern 510.

Specifically, in one embodiment, as shown in FIG. 6, the first auxiliary pattern 521 is arranged according to the first auxiliary spacing A1, the second auxiliary pattern 522 is arranged according to the second auxiliary spacing A2, the third auxiliary pattern 522 is arranged according to the third auxiliary spacing B1, and the fourth auxiliary pattern 524 is arranged according to the fourth auxiliary spacing B2.

In one embodiment, the auxiliary patterns may have a strip shape. Each auxiliary pattern may have a length close to a length of a side of the main pattern that is adjacent to the auxiliary pattern.

On one hand, the extending directions of the first side 511 and the second side 512 are perpendicular to the first direction X1, and position information of each main pattern 510 may be obtained according to the first side 511 and the second side 512. Accordingly, the position information of each main pattern in the first direction X1 may be obtained. On the other hand, according to the position information of each main pattern 510 in the first direction X1, position information of the auxiliary patterns adjacent to each main pattern 510 may be acquired. Moreover, according to the position information of the adjacent auxiliary patterns, auxiliary patterns adjacent to each main pattern 510 may be arranged.

Accordingly, the position information of the adjacent auxiliary patterns of the main pattern 510 may be obtained for the azimuth angle that may change along the first direction X1. That is, the adjacent auxiliary patterns may be arranged according to the azimuth angle, such that the adjacent auxiliary patterns may be suitable for different azimuth angles. As such, in a photolithography system using extreme ultraviolet light as a light source, the size of the process window of the exposure process for each main pattern 510 may be increased, and accuracy of the photolithography pattern formed may thus be improved.

In some other embodiments, the target layout also includes a plurality of first areas and a plurality of second areas. For each main pattern, one first area is located around the main pattern, and for each first area, one second area is located around the first area. For each main pattern, auxiliary patterns adjacent to the main pattern are arranged in the first area, and auxiliary patterns that are not adjacent to the main pattern are arranged in the second area.

The correction method of the mask layout also includes, according to the position information of each main pattern or the position information of the auxiliary patterns adjacent to each main pattern, obtaining position information of fifth auxiliary patterns of each main pattern. The fifth auxiliary patterns of a main pattern are auxiliary patterns that are not adjacent to the main pattern, and are located in the second area of the main pattern. The method also includes arranging the fifth auxiliary patterns of each main pattern according to the position information of the fifth auxiliary patterns.

The disclosed method for correcting mask layout/patterns consistent with various disclosed embodiments may be used to form a mask containing the corrected layout/patterns. The formed mask may be used for a photolithography process. The photolithography process may include an exposure process, a development process after the exposure process, and an etching process after the development process. In the exposure process, light may be irradiated onto, e.g., a photoresist-coated silicon wafer through regions in the mask where light can pass through, and the coated photoresist may undergo chemical reactions under the irradiation of light. In the development process, photolithographic patterns may be formed by using the difference in the degree of dissolution of the exposed and unexposed photoresist in the developer, thus the mask patterns may be transferred from the mask to the photoresist to form a patterned photoresist layer. In the etching process, the silicon wafer may be etched using the patterned photoresist layer as an etch mask to form structures corresponding to the mask patterns. The mask patterns may be further transferred from the patterned photoresist layer to the silicon wafer.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method comprising:
providing a target layout, wherein the target layout includes a plurality of main patterns, each main pattern of the plurality of main patterns includes a first side and a second side that are opposite each other, extending directions of the first side and the second side are perpendicular to a first direction, in the first direction, a spacing between the first side and a center of the target layout is smaller than a spacing between the second side and the center of the target layout, each main pattern also includes a third side and a fourth side that are opposite each other, extension directions of the third side and the fourth side are perpendicular to a second direction, a direction from a midpoint of the third side pointing to a midpoint of the fourth side coincides with the second direction, and the second direction and the first direction are perpendicular to each other;
according to the first side and the second side, acquiring position information of each main pattern;
according to the position information of each main pattern, obtaining position information of auxiliary patterns adjacent to the each main pattern, including:
in the first direction, providing a first optimal spacing D1, a first maximum spacing D2 and a first minimum spacing D3, wherein:
the first optimal spacing D1 is, without influence of an azimuth angle of an incident ray on a main pattern, an optimal spacing in the first direction between a first side of the main pattern and a first auxiliary pattern, or an optimal spacing between a second side of the main pattern and a second auxiliary pattern, wherein the first auxiliary pattern is an auxiliary pattern adjacent to the first side of the main pattern, and the second auxiliary pattern is an auxiliary pattern adjacent to the second side of the main pattern;

the first maximum spacing D2 is, in the target layout, a minimum spacing between the first side of the main pattern at a position closest to an edge of the target layout and a contour of the first auxiliary pattern of the main pattern;

the first minimum spacing D3 is, in the target layout, a minimum spacing between the second side of the main pattern at a position closest to an edge of the target layout and a contour of the second auxiliary pattern of the main pattern; and a sum of the first maximum spacing D2 and the first minimum spacing D3 is equal to twice of the first optimal spacing D1, the first optimal spacing D1 being greater than the first minimum spacing D3 and less than the first maximum spacing D2;

according to the position information of the auxiliary patterns adjacent to each main pattern, arranging the auxiliary patterns adjacent to each main pattern around the each main pattern; and forming a mask based on the target layout after arranging the auxiliary patterns adjacent to each main pattern around the each main pattern.

2. The method according to claim 1, wherein acquiring the position information of each main pattern comprises, according to a central point of the main pattern, obtaining a first spacing of the main pattern, wherein:

the central point of the main pattern is a point located between the first side and the second side of the main pattern;

in the first direction, a spacing between the central point of the main pattern and the first side of the main pattern is equal to a spacing between the central point of the main pattern and the second side of the main pattern; and the first spacing of the main pattern is, in the first direction, a spacing between the central point of the main pattern and the center of the target layout.

3. The method according to claim 2, wherein according to the position information of each main pattern, obtaining the position information of auxiliary patterns adjacent to each main pattern comprises:

obtaining position information of a first auxiliary pattern and a second auxiliary pattern, wherein the first auxiliary pattern is an auxiliary pattern adjacent to the first side of the main pattern, and the second auxiliary pattern is an auxiliary pattern adjacent to the second side of the main pattern.

4. The method according to claim 3, wherein obtaining the position information of the first auxiliary pattern and the second auxiliary pattern includes obtaining a first auxiliary spacing and a second auxiliary spacing, wherein:

the first auxiliary spacing is, in the first direction, a spacing between a center of the first auxiliary pattern and the central point of the main pattern;

the second auxiliary spacing is, in the first direction, a spacing between a center of the second auxiliary pattern and the central point of the main pattern; and when the first spacing of the main pattern is equal to zero, the first auxiliary spacing is equal to the second auxiliary spacing.

5. The method according to claim 3, wherein obtaining the position information of the first auxiliary pattern and the second auxiliary pattern includes obtaining a first auxiliary spacing and a second auxiliary spacing, wherein:

the first auxiliary spacing is, in the first direction, a spacing between a center of the first auxiliary pattern and the central point of the main pattern;

the second auxiliary spacing is, in the first direction, a spacing between a center of the second auxiliary pattern and the central point of the main pattern; and when the first spacing of the main pattern is greater than zero, the first auxiliary spacing is greater than the second auxiliary spacing.

6. The method according to claim 3, wherein obtaining the position information of the first auxiliary pattern and the second auxiliary pattern includes obtaining a first auxiliary spacing and a second auxiliary spacing, wherein:

the first auxiliary spacing is, in the first direction, a minimum spacing between a contour of the first auxiliary pattern and the first side of the main pattern;

the second auxiliary spacing is, in the first direction, a minimum spacing between a contour of the second auxiliary pattern and the second side of the main pattern; and when the first spacing of the main pattern is equal to zero, the first auxiliary spacing is equal to the second auxiliary spacing.

7. The method according to claim 3, wherein obtaining the position information of the first auxiliary pattern and the second auxiliary pattern includes obtaining a first auxiliary spacing and a second auxiliary spacing, wherein:

the first auxiliary spacing is, in the first direction, a minimum spacing between a contour of the first auxiliary pattern and the first side of the main pattern;

the second auxiliary spacing is, in the first direction, a minimum spacing between a contour of the second auxiliary pattern and the second side of the main pattern; and when the first spacing of the main pattern is greater than zero, the first auxiliary spacing is greater than the second auxiliary spacing.

8. The method according to claim 2, wherein according to the position information of each main pattern, obtaining the position information of auxiliary patterns adjacent to each main pattern comprises obtaining position information of a third auxiliary pattern and a fourth auxiliary pattern, wherein:

the third auxiliary pattern is an auxiliary pattern adjacent to the third side of the main pattern; and the fourth auxiliary pattern is an auxiliary pattern adjacent to the fourth side of the main pattern.

9. The method according to claim 8, wherein obtaining the position information of the third auxiliary pattern and the fourth auxiliary pattern includes obtaining a third auxiliary spacing and a fourth auxiliary spacing, wherein:

the third auxiliary spacing is, in the second direction, a spacing between a center of the third auxiliary pattern and the central point of the main pattern;

the fourth auxiliary spacing is, in the second direction, a spacing between a center of the fourth auxiliary pattern and the central point of the main pattern; and the third auxiliary spacing is smaller than the fourth auxiliary spacing.

10. The method according to claim 8, wherein obtaining the position information of the third auxiliary pattern and the fourth auxiliary pattern includes obtaining a third auxiliary spacing and a fourth auxiliary spacing, wherein:

the third auxiliary spacing is, in the second direction, a minimum spacing between a contour of the third auxiliary pattern and the third side of the main pattern;

the fourth auxiliary spacing is, in the second direction, a minimum spacing between a contour of the fourth auxiliary pattern and the fourth side of the main pattern; and the third auxiliary spacing is smaller than the fourth auxiliary spacing.

11. The method according to claim 2, wherein acquiring the position information of each main pattern also comprises:
setting a first coordinate axis along the first direction, wherein the center of the target layout coincides with a zero coordinate of the first coordinate axis, and coordinates of boundaries of the target layout on the first coordinate axis are $-L/2$ and $L/2$ respectively; and
according to the first spacing of each main pattern, obtaining a coordinate x of the main pattern on the first coordinate axis.

12. The method according to claim 11, wherein according to the position information of each main pattern, obtaining the position information of the auxiliary patterns adjacent to each main pattern also comprises:
in the second direction, providing a second optimal spacing K1 and a second largest spacing K2, wherein the second optimal spacing K1 is, when the first spacing of a main pattern is equal to zero, a minimum spacing between a contour of a third auxiliary pattern of the main pattern and the third side of the main pattern, the second maximum spacing K2 is, in the target layout, a minimum spacing between the third edge of a main pattern at a position closest to an edge of the target layout and a contour of the third auxiliary pattern of the main pattern, the third auxiliary pattern is an auxiliary pattern adjacent to the third side of the main pattern, and K1<K2;
obtaining position information of a third auxiliary pattern, wherein the third auxiliary pattern is an auxiliary pattern adjacent to the third side of the main pattern; and
obtaining the position information of the third auxiliary pattern includes obtaining a third auxiliary spacing B1:

$$B1 = K1 + \frac{|x|}{\left(\frac{L}{2}\right)}(K2 - K1), -\frac{L}{2} < x \le \frac{L}{2},$$

wherein:
the third auxiliary spacing B1 is, in the second direction, a minimum spacing between a contour of the third auxiliary pattern and the third side of the main pattern, or a spacing between a center of the third auxiliary pattern and the central point of the main pattern.

13. The method according to claim 11, wherein according to the position information of each main pattern, obtaining the position information of the auxiliary patterns adjacent to each main pattern also comprises:
in the second direction, providing a third optimal spacing K3 and a second minimum spacing K4, wherein the third optimal spacing K3 is, when the first spacing of a main pattern is equal to zero, a minimum spacing between a contour of a fourth auxiliary pattern of the main pattern and a fourth side of the main pattern, the second minimum spacing K4 is, in the target layout, a minimum spacing between a fourth edge of a main pattern at a position closest to an edge of the target layout and a contour of the fourth auxiliary pattern of the main pattern, and K4<K3; and
obtaining position information of a fourth auxiliary pattern, wherein the fourth auxiliary pattern is an auxiliary pattern adjacent to the fourth side of the main pattern, and obtaining the position information of the fourth auxiliary pattern includes obtaining a fourth auxiliary spacing B2:

$$B2 = K3 - \frac{|x|}{\left(\frac{L}{2}\right)}(K3 - K4), -\frac{L}{2} < x \le \frac{L}{2},$$

wherein:
the fourth auxiliary spacing B2 is, in the second direction, a minimum spacing between a contour of the fourth auxiliary pattern and the fourth side of the main pattern, or a spacing between a center of the fourth auxiliary pattern and the central point of the main pattern.

14. The method according to claim 1, wherein according to the position information of each main pattern, obtaining the position information of the auxiliary patterns adjacent to each main pattern also comprises obtaining position information of the first auxiliary pattern, wherein:
obtaining the position information of the first auxiliary pattern includes obtaining a first auxiliary spacing A1:

$$\begin{cases} A1 = D1 - \frac{x}{\left(\frac{L}{2}\right)}(D1 - D3), -\frac{L}{2} < x \le 0 \\ A1 = D1 - \frac{x}{\left(\frac{L}{2}\right)}(D3 - D1), 0 < x \le \frac{L}{2} \end{cases},$$

wherein:
the first auxiliary spacing is, in the first direction, a minimum spacing between a contour of the first auxiliary pattern and the first side of the main pattern, or a spacing between a center of the first auxiliary pattern and the central point of the main pattern; and
the first optimal spacing D1 is, without the influence of the azimuth angle of the incident ray on the main pattern, the optimal spacing in the first direction between the first side of the main pattern and the first auxiliary pattern.

15. The method according to claim 14, wherein according to the position information of each main pattern, obtaining the position information of the auxiliary patterns adjacent to each main pattern also comprises obtaining position information of the second auxiliary pattern, wherein:
obtaining the position information of the second auxiliary pattern includes obtaining a second auxiliary spacing A2:

$$\begin{cases} A2 = D1 + \frac{x}{\left(\frac{L}{2}\right)}(D1 - D3), -\frac{L}{2} < x \le 0 \\ A2 = D1 + \frac{x}{\left(\frac{L}{2}\right)}(D3 - D1), 0 < x \le \frac{L}{2} \end{cases},$$

wherein:
the second auxiliary spacing A2 is, in the first direction, a minimum spacing between a contour of the second auxiliary pattern and the second side of the main pattern, or a spacing between a center of the second auxiliary pattern and the central point of the main pattern; and the first optimal spacing D1 is, without the influence of the azimuth angle of the incident ray on the main pattern, the optimal spacing in the first direction between the second side of the main pattern and the second auxiliary pattern.

16. The method according to claim 15, wherein according to the position information of each main pattern, obtaining the position information of the auxiliary patterns adjacent to each main pattern also comprises:

in the second direction, providing a second optimal spacing K1 and a second largest spacing K2, wherein the second optimal spacing K1 is, when the first spacing of the main pattern is equal to zero, a minimum spacing between a contour of a third auxiliary pattern of the main pattern and the third side of the main pattern, the second maximum spacing K2 is, in the target layout, a minimum spacing between a third edge of a main pattern at a position closest to an edge of the target layout and a contour of a third auxiliary pattern of the main pattern, and K1<K2;

obtaining position information of the third auxiliary pattern, wherein the third auxiliary pattern is an auxiliary pattern adjacent to the third side of the main pattern; and obtaining the position information of the third auxiliary pattern includes obtaining a third auxiliary spacing B1:

$$B1 = K1 + \frac{|x|}{\left(\frac{L}{2}\right)}(K2 - K1), -\frac{L}{2} < x \le \frac{L}{2},$$

wherein:

the third auxiliary spacing B1 is, in the second direction, a minimum spacing between a contour of the third auxiliary pattern and the third side of the main pattern, or a spacing between a center of the third auxiliary pattern and the central point of the main pattern.

17. The method according to claim 16, wherein according to the position information of each main pattern, obtaining the position information of the auxiliary patterns adjacent to each main pattern also comprises:

in the second direction, providing a third optimal spacing K3 and a second minimum spacing K4, wherein the third optimal spacing K3 is, when the first spacing of a main pattern is equal to zero, a minimum spacing between a contour of a fourth auxiliary pattern of the main pattern and a fourth side of the main pattern, the second minimum spacing K4 is, in the target layout, a minimum spacing between a fourth edge of a main pattern at a position closest to an edge of the target layout and a contour of the fourth auxiliary pattern of the main pattern, the fourth auxiliary pattern is an auxiliary pattern adjacent to the fourth side of the main pattern, and K1<K2<K4<K3;

obtaining position information of a fourth auxiliary pattern, wherein the fourth auxiliary pattern is an auxiliary pattern adjacent to the fourth side of the main pattern; and obtaining the position information of the fourth auxiliary pattern includes obtaining a fourth auxiliary spacing B2:

$$B2 = K3 - \frac{|x|}{\left(\frac{L}{2}\right)}(K3 - K4), -\frac{L}{2} < x \le \frac{L}{2},$$

wherein, the fourth auxiliary spacing B2 is, in the second direction, a minimum spacing between a contour of the fourth auxiliary pattern and the fourth side of the main pattern, or a spacing between a center of the fourth auxiliary pattern and the central point of the main pattern.

18. The method according to claim 1, wherein according to the position information of each main pattern, obtaining the position information of the auxiliary patterns adjacent to each main pattern also comprises obtaining position information of a second auxiliary pattern, wherein:

the second auxiliary pattern is an auxiliary pattern adjacent to the second side of the main pattern; and obtaining the position information of the second auxiliary pattern includes obtaining a second auxiliary spacing A2:

$$\begin{cases} A2 = D1 + \frac{x}{\left(\frac{L}{2}\right)}(D1 - D3), -\frac{L}{2} < x \le 0 \\ A2 = D1 + \frac{x}{\left(\frac{L}{2}\right)}(D3 - D1), 0 < x \le \frac{L}{2} \end{cases},$$

wherein:

the second auxiliary spacing A2 is, in the first direction, a minimum spacing between a contour of the second auxiliary pattern and the second side of the main pattern, or a spacing between a center of the second auxiliary pattern and the central point of the main pattern.

19. The method according to claim 1, wherein:

the target layout also includes a plurality of first areas and a plurality of second areas, wherein for each main pattern, one first area of the plurality of first areas is located around the main pattern, and for each first area of the plurality of first areas, one second area of the plurality of second areas is located around the first area, and for each main pattern, auxiliary patterns adjacent to the main pattern are arranged in the first area, and auxiliary patterns that are not adjacent to the main pattern are arranged in the second area; and the correction method of the mask layout also includes:

according to the position information of each main pattern or the position information of the auxiliary patterns adjacent to each main pattern, obtaining position information of fifth auxiliary patterns of each main pattern, wherein the fifth auxiliary patterns of each main pattern are auxiliary patterns that are not adjacent to the main pattern, and are located in the second area of the main pattern; and arranging the fifth auxiliary patterns of each main pattern according to the position information of the fifth auxiliary patterns.

* * * * *